(12) United States Patent
Wu et al.

(10) Patent No.: US 7,304,366 B2
(45) Date of Patent: Dec. 4, 2007

(54) SELF CORRECTING MULTIPLE-LINK FUSE

(75) Inventors: Shieh-Yang Wu, Hsin-Chu (TW); Shi-Bai Chen, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 10/910,008

(22) Filed: Aug. 2, 2004

(65) Prior Publication Data

US 2006/0022300 A1   Feb. 2, 2006

(51) Int. Cl.
*H01L 29/00* (2006.01)
*H01L 21/82* (2006.01)
*G11C 17/00* (2006.01)

(52) U.S. Cl. ............... 257/529; 257/536; 257/538; 438/132; 365/96; 365/325.7

(58) Field of Classification Search ........... 257/529, 257/536, 538; 438/132; 365/96, 225.7, 365/325.7
See application file for complete search history.

(56) References Cited

U.S. PATENT DOCUMENTS

| | | | | |
|---|---|---|---|---|
| 4,689,494 A | * | 8/1987 | Chen et al. | 327/525 |
| 5,708,291 A | * | 1/1998 | Bohr et al. | 257/529 |
| 5,726,585 A | * | 3/1998 | Kim | 326/38 |
| 5,966,339 A | * | 10/1999 | Hsu et al. | 365/225.7 |
| 6,008,523 A | * | 12/1999 | Narayan et al. | 257/529 |
| 6,175,261 B1 | * | 1/2001 | Sundararaman et al. | 327/525 |
| 6,242,790 B1 | * | 6/2001 | Tsui et al. | 257/529 |
| 6,271,574 B1 | * | 8/2001 | Delpech et al. | 257/529 |
| 6,323,534 B1 | * | 11/2001 | Marr et al. | 257/529 |
| 6,337,507 B1 | * | 1/2002 | Bohr et al. | 257/529 |
| 6,354,496 B1 | * | 3/2002 | Murphy et al. | 235/383 |
| 6,356,496 B1 | * | 3/2002 | Carroll et al. | 365/225.7 |
| 6,410,367 B2 | * | 6/2002 | Marr et al. | 438/132 |
| 6,495,902 B2 | * | 12/2002 | Marr et al. | 257/529 |
| 6,551,864 B2 | * | 4/2003 | Marr et al. | 438/132 |
| 6,580,156 B1 | * | 6/2003 | Ito et al. | 257/665 |
| 6,607,945 B2 | * | 8/2003 | Tsui | 438/132 |
| 6,642,601 B2 | * | 11/2003 | Marshall et al. | 257/529 |
| 6,661,330 B1 | * | 12/2003 | Young | 337/297 |
| 6,956,277 B1 | * | 10/2005 | Wu et al. | 257/529 |
| 2005/0087836 A1 | * | 4/2005 | Wu | 257/529 |
| 2006/0006494 A1 | * | 1/2006 | Wu | 257/528 |

* cited by examiner

*Primary Examiner*—Howard Weiss
*Assistant Examiner*—Shrinivas H. Rao
(74) *Attorney, Agent, or Firm*—Tung & Associates

(57) ABSTRACT

An improved fuse link structure and fuse blowing method, the fuse-link structure including a plurality of elongated fuse-link members comprising polysilicon electrically connected in parallel according to a common input Voltage contact and common output current contact to form a fuse-link structure; and, wherein at least a portion of the plurality of elongated fuse-link comprise a different electrical resistance with respect to one another according to a variable condition selected from the group consisting of critical dimension, polysilicon doping condition, and silicide agglomeration condition.

20 Claims, 3 Drawing Sheets

SELF CORRECTING MULTIPLE-LINK FUSE

FIELD OF THE INVENTION

This invention generally relates to semiconductor processing methods and structures and more particularly to an improved polysilicon fuse link structure and method for forming the same.

BACKGROUND OF THE INVENTION

Fuses are frequently used to reconfigure memory and logic circuitry. For example, in dynamic or static memory chips, defective memory cells or circuitry may be replaced by selectively blowing (destroying) fuses associated with the defective circuitry while activating redundant circuitry to form new circuitry. This circuit rerouting technique using selectively destroyed fuse links contributes to enhanced yields without the necessity of scrapping defective process wafers.

Generally, fuse links, made of a conductive material may be destroyed to form an open circuit by passing an excessive electrical current through the circuitry which melts the fuse link or otherwise increases the resistance of the fuse link to effectively block conduction below a certain voltage.

Although both electrical current and laser ablation have been used to blow fuses, passing of electrical current is preferred in certain situations since a pre-determined current may be programmed and fuse links selected with a greater degree of facility compared to laser ablation operations. For example, programmed electrical current used to blow selected fuses may facilitate field operations to repair devices and trim analog devices for suitable operation.

One problem with programmable fuses of the prior art is the tendency for processing variables to result in a wide variation of electrical resistances in the fuses. As a result, frequently, the fuse electrical resistance is formed out of specification and the programmed Voltage and current is either too large for the fuse resistance, causing possible damage to the circuitry, or too small, resulting in unblown fuses.

As device sizes decrease, including the fuse link dimension, resistance variations due to processing variables such as altered critical dimension of the fuse link as well as material inhomogeneities increasingly result in a wide distribution of fuse link electrical resistances, reducing the reliability of fuse blowing operations and increasing the possibility of damage to the circuitry.

Therefore, there is a need in the semiconductor processing art to develop an improved fuse-link structure and method of using the same in a fuse blowing process such that a fuse-link structure is formed with a predetermined electrical resistance variation and consequently reliably blown in a fuse blowing process.

It is therefore an object of the invention to develop an improved fuse-link structure and method of using the same in a fuse blowing process such that a fuse-link structure is formed with a predetermined electrical resistance variation and consequently reliably blown in a fuse blowing process, in addition to overcoming other shortcomings of the prior art.

SUMMARY OF THE INVENTION

To achieve the foregoing and other objects, and in accordance with the purposes of the present invention, as embodied and broadly described herein, the present invention provides an improved fuse link structure and method of using the same in a fuse blowing process.

In a first embodiment the improved fuse-link structure includes a plurality of elongated fuse-link members comprising polysilicon electrically connected in parallel according to a common input Voltage contact and common output current contact to form a fuse-link structure; and, wherein at least a portion of the plurality of elongated fuse-link members comprise a different electrical resistance with respect to one another according to a variable condition selected from the group consisting of critical dimension, polysilicon doping condition, and silicide agglomeration condition.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the present invention is explained in exemplary implementation with respect to dual and triple fuse-link member structures electrically connected in parallel to a common input Voltage contact and a common output current contact, it will be appreciated that a greater or lesser multiplicity of fuse-links members may be formed. The fuse-link structure and method is advantageously used to reduce an overall effective resistance of the multiple fuse-link structure and thereby have a self-correcting effect on a variation in the individual fuse-link member electrical resistance variation due to processing variables. Consequently, the fuse-link structure is more readily formed within a narrow pre-determined effect resistance to correspond to a narrowed fuse-blowing Voltage window for application of a fuse-blowing Voltage in a programmable fuse-blowing process to improve a yield of blown fuses.

Figure 1A:
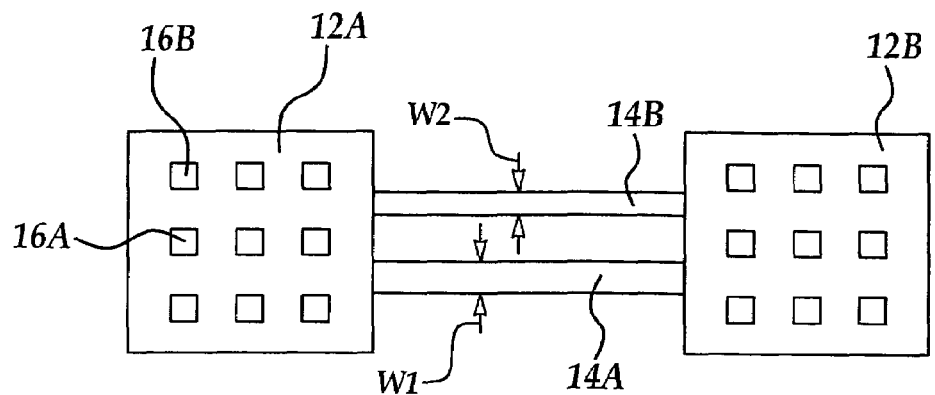
FIGS. 1A and 1B are top planar views of an exemplary multiple fuse-link structure according to an embodiment of the present invention.

For example, referring to FIG. 1A is shown a top planar view of an exemplary multiple fuse-link structure. Shown are polysilicon contact regions 12A and 12B, separated a predetermined distance for formation of polysilicon fuse-link members 14A, and 14B. For example, multiple electrical contact areas e.g., 16A, 16B, formed by conventional means, for example, forming silicided regions over the polysilicon contact regions, are provided for making electrical connection with circuitry located elsewhere in the device and with the fuse-link members 14A and 14B. Although not shown, preferably the electrical contact areas e.g., 16A and 16B are be used to form a common Voltage input to the fuse-link members 14A and 14B. In an important aspect of the invention, the fuse-link members 14A and 14B are connected in parallel to a common Voltage input and current output to form parallel electrical resistances.

Still referring to FIG. 1A, fuse-link member 14A is formed having a relatively larger width W1 and fuse-link member 14B is formed having a relatively smaller width W2. It will be appreciated that the fuse-link members e.g., 14A and 14B are preferably formed having different electrical resistances, e.g., different widths. It will also be appreciated that the fuse-link members may have variable thicknesses with respect to one another, but generally are formed to have about same thickness to minimize processing steps.

In one embodiment, at least one of the fuse-link members is doped with a P or N type dopant according to a conventional ion implantation process. For example, boron (B) is typically used for a P type dopant and arsenic (As) or phosphorous (P) are typically used as an N type dopant. Preferably, a silicide layer is formed as an uppermost layer over the polysilicon members 14A and 14B by conventional methods following doping (e.g., ion implantation) of the polysilicon. Preferably, the silicide layer is formed of titanium (e.g., $TiS_2$), cobalt ($CoSi_2$), Molybdenum (e.g., $MoSi_2$) or Nickel (e.g., NiSi); however, other silicides may be used as well.

It has been found that during the silicide formation process, for example following deposition of a metal e.g., Ti for forming the silicide, and followed by a subsequent thermal annealing process to form the desired low resistance silicide phase, e.g., $TiSi_2$, as is known in the art, agglomeration of the silicon contained in the silicide layer frequently creates portions of high electrical resistance in the polysilicon fuse-link member thereby increasing an initial resistance of a fuse-link member and thereby increasing a resistance variation among fuse-link structures.

For example, it has particularly been found that when the fuse-link member has a width less than about 0.5 microns, more preferably less that about 0.25 microns, the tendency of silicon agglomeration into high resistance regions in the fuse-link member is enhanced causing wide electrical resistance variations in individual fuse-link members. This variation of electrical resistance is undesirable in a programmable fuse-blowing process where individual fuse-link structures are individually supplied with a selected Voltage to blow the fuse-link member according to prior art processes. For example, a proper fuse-blowing Voltage for a programmable fuse blowing process cannot be reliably selected and applied due to the large variations in fuse-link member resistances, reducing a successful fuse-blowing yield.

According to an advantage of the present invention, the effective electrical resistance variation of individual fuse-link members, for example, due to process variation such as silicon agglomeration during the silicide layer formation process, variations in critical dimension, and/or polysilicon doping conditions, is reduced according to the present invention by providing multiple fuse-link members electrically connected in parallel to a common Voltage input and current output.

For example, a fuse-link structure having multiple fuse-link members electrically connected in parallel lowers the effective resistance of the fuse-link structure, the effective resistance being the sum of the reciprocal resistances of the individual fuse-link members. As a result, the variation of the effective resistance as compared with the variation of the individual fuse-link member resistances is reduced. Consequently, the required fuse blowing Voltage has a narrower window, increasing the reliability of the programmable fuse-blowing process thereby increasing a successful fuse blowing yield. For example, the narrower required Voltage window achieved by providing multiple fuse-link members electrically connected in parallel avoids supplying under-Voltages to reduce a fuse blow yield or over-Voltages to damage the device.

In exemplary operation, a selected fuse blowing Voltage falling within a Voltage window is selectively programmed for application to a multiple fuse-link structure. The individual electrical resistances of the individual fuse-link members is preferably selected such that the variation of the electrical resistance of one or more of the individual fuse-link members, for example due to silicide agglomeration, critical dimension variation and/or polysilicon doping condition, falls within a pre-determined effective resistance (parallel resistance) window. Correspondingly, the fuse-link structure also falls within a pre-determined fuse-blowing Voltage window for successful fuse blowing of the multiple fuse-link structure by application of a common fuse blowing Voltage.

In exemplary operation, the electrical resistance of one or more of the individual fuse-link members is altered (increased) by the passage of current in response to an applied Voltage, for example inducing silicide agglomeration to form high resistance regions following application of the fuse blowing Voltage. The fuse blowing operation is designed to alter (increase) the electrical resistance of one or more of the fuse-link members such that the fuse-link structure has a final effective electrical resistance that prevents current flow below a predetermined threshold Voltage.

Figure 1B:
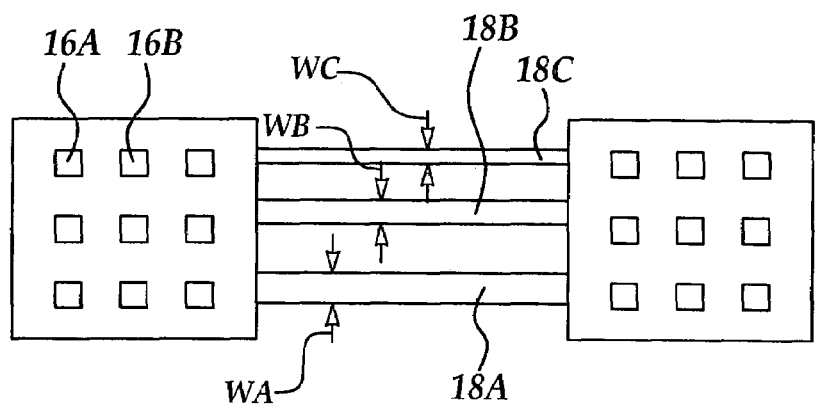

Referring to FIG. 1B, in another aspect of the invention, multiple fuse-link members, e.g., 18A, 18B, and 18C are formed with, for example, polysilicon fuse-link member 18A having a width WA, greater than about 0.25 microns, an uppermost layer of silicide, and a doped or undoped polysilicon lowermost layer. Polysilicon fuse-link member 18B is formed of doped (e.g., N-type or P-type dopants) polysilicon, having a width, WB for example less than about 0.25 microns and an uppermost layer of silicide, while polysilicon fuse-link member 18B is formed a having a width WC, for example, equal or less than WB, and being formed of either doped or undoped polysilicon and with or without an overlying silicide layer. It will be appreciated that the electrical resistances of the individual fuse-link members is determined by the resistivity of the fuse-link member material including the width, thickness, and length of the members. It will also be appreciated that the length of the members may be varied, for example being formed non-parallel to each other to increase a length span, but are more preferably formed to have a desired electrical resistance by varying a width and/or thickness (critical dimension) as well as altering the resistivity of the member material, for example by providing doped or undoped polysilicon lowermost layer and including providing an unagglomerated silicide uppermost layer.

For example, it has been found that the agglomeration of silicide in the annealing process to induce a phase change of the silicide to the desired low resistance silicide phase, for example in fuse-link members having a width of less than about 0.5 microns, more preferably less than about 0.25 microns, that the presence or absence of polysilicon doping (e.g., N and P-type dopants) including a doping level, affects the agglomeration behavior of the silicide in the silicide layer formation process and thereby contributes to the variability of the individual electrical resistances of the fuse-link members.

Figure 1C:
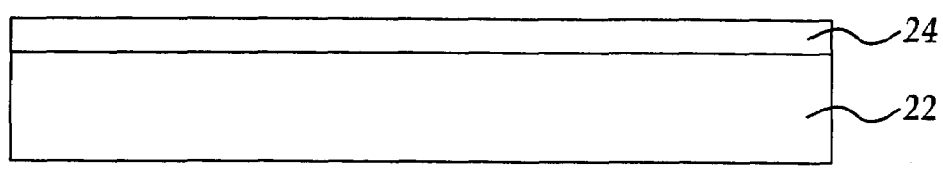
FIG. 1C is a cross-sectional side view of an exemplary portion of a fuse-link member according to an embodiment.

Referring to FIG. 1C is shown a cross sectional view of an exemplary portion of a fuse-link member having a lowermost polysilicon layer 22 and an uppermost silicide layer 24 according to preferred embodiments. For example, the polysilicon fuse-link members may be formed by first depositing a layer of polysilicon by conventional methods, followed by deposition of a metal to form a silicide, for example Ti, Co, Mo, and Ni. A single or multiple step annealing process is then typically carried out to first form the high resistance phase followed by formation of a lower resistance phase by annealing at a higher temperature between about 350° C. and about 900° C. Silicon agglomeration frequently occurs in the high temperature annealing process related to an inability to nucleate silicide grains due to the narrowness (width) of the fuse-link member, for example being less than about 0.5 microns and particularly less than about 0.25 microns (preferred range 5 nm to 250 nm). It will be appreciated that the thickness of the polysilicon layer and silicide may vary depending on the magnitude of desired electrical resistances. Exemplary thicknesses for the polysilicon layer include a thickness of from about 500 Angstroms to about 2500 Angstroms and for the silicide layer between about 20 Angstroms to about 1000 Angstroms (preferred range 50 Angstroms to 450 Angstroms).

For example, to reduce silicide agglomeration of the fuse-link members during the silicide layer formation process, but maintain agglomeration during the fuse blowing process, the polysilicon and/or the silicide layer may be subjected to ion implantation processes prior to annealing the silicide to form the low resistance phase. For example, ion implantation with Mo to a level between about 0.01 wt % to about 2 wt % and/or ion implantation with an appropriate ion e.g., Si at an appropriate implantation energy (e.g., 100 keV to about 300 keV) to form a surface polysilicon amorphous layer is first carried out. The ion implantation and/or polysilicon amorphization process can serve to reduce the agglomeration of silicide during the silicide formation process, for example during annealing in nitrogen at greater than about 650° C. Silicon agglomeration in the fuse blowing process, however, is preferably maintained during the fuse blowing process, for example by inducing agglomeration at higher temperatures reached in the fuse-blowing process.

In addition, the presence or absence of N and P-type dopants in the polysilicon portion of the fuse-link member can affect polysilicon etching rates, making the control of the critical dimensions difficult, for example resulting in variable widths of the individual fuse-link members when differently doped (e.g., undoped, N-doped, and P-doped) members are present during a conventional polysilicon etching process to form the members. However, the presence of different doping conditions is frequently desirable and necessary to achieve the desired individual fuse-link member electrical resistances as well as the desired effective parallel resistance of the multiple fuse-link structure.

Accordingly, in an aspect of the present invention, the multiple fuse-link members are formed having different electrical resistances according to at least one of a different polysilicon doping condition, critical dimension (e.g., width and thickness), and the degree of silicon agglomeration in a silicide layer, for example an uppermost layer. The individual fuse-link members are electrically connected in parallel to a common input Voltage to produce a desired effective parallel resistance as explained above. Preferably the effective resistance including the multiple fuse-link parallel connected members is reduced by about a factor of 2 or greater compared to the resistance of a serially connected (electrically connected in series) fuse-link structure.

As such, a variation in the effective resistance is correspondingly reduced compared to a serially connected fuse-link structures making it easier to form a plurality of fuse-link structures to fall within a narrower selectively programmable fuse-blowing Voltage window thereby improving a fuse-blow yield.

Figure 2A:
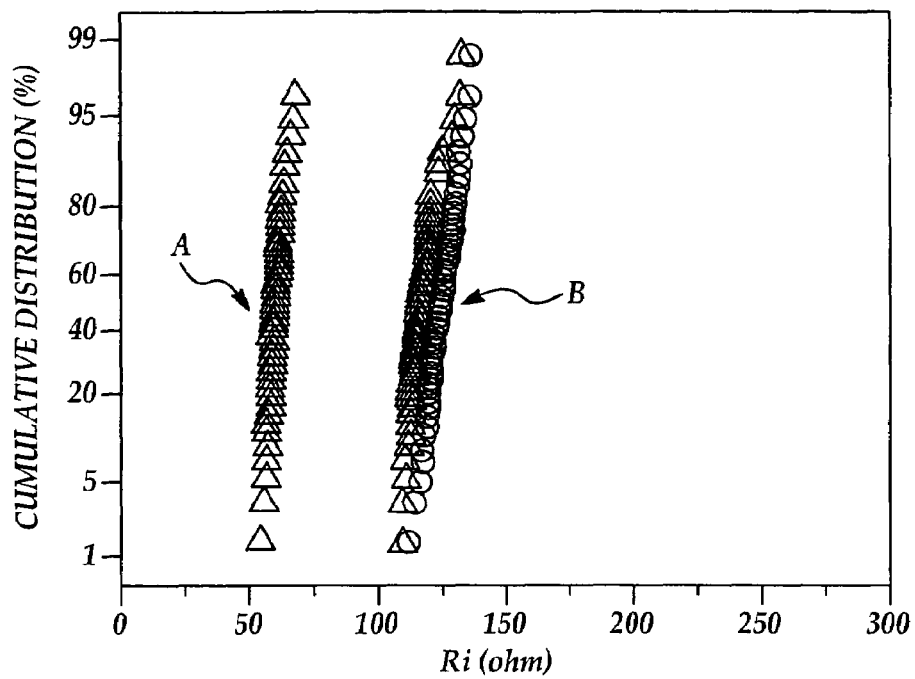
FIGS. 2A and 2B are data representations of the electrical resistances of fuse link members formed according to embodiments of the invention and following undergoing a fuse blowing process according to an embodiment of the invention.
Figure 2B:
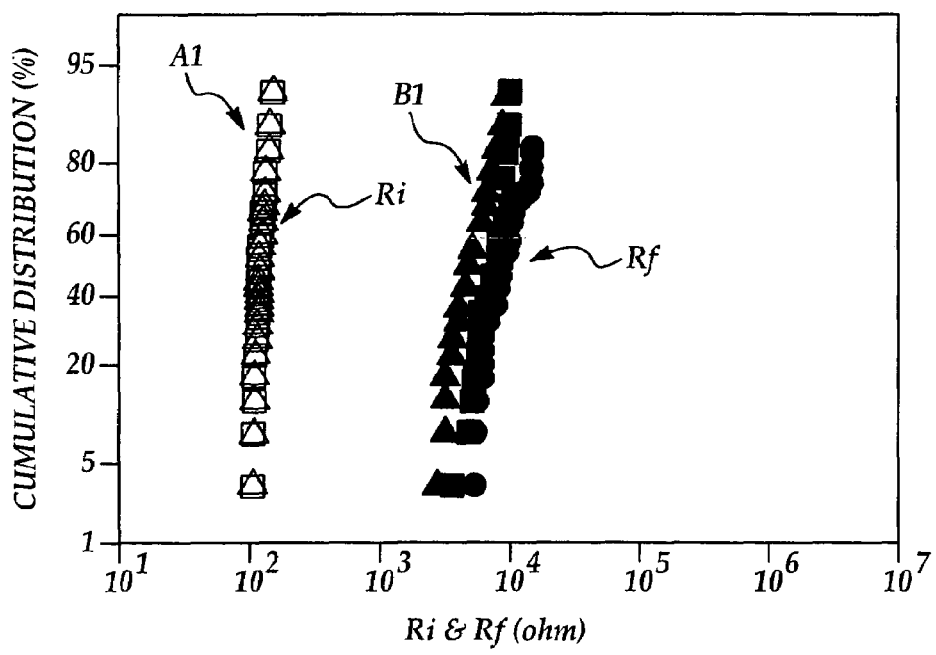

Referring to FIGS. 2A and 2B are shown cumulative distribution plots of data collected on fuse-link structures formed according to preferred embodiments, for example having a width of about 0.1 micron and including multiple fuse-link-members having a silicide layer overlying a doped polysilicon fuse. In FIG. 2A, the effective resistance (Ri) prior to a fuse blowing operation of fuse-link structures formed according to preferred embodiments is represented by data line shown at A which is contrasted to fuse-link structures of the prior art shown in data lines shown at B. Not only is the initial effective resistance (Ri) decreased in magnitude, but the smaller deviation from straight line behavior seen in data line shown at A, according to preferred fused-linked structure embodiments, thereby demonstrating a smaller variation in resistance among a distribution of fuse-link structures compared to prior art fuse-link structures represented by data lines shown at B.

In FIG. 2B is shown a similar plot showing the initial effect resistance (Ri) shown in data line at A1 prior to a fuse blowing operation compared to an effective resistance (Rf) shown in data lines shown at B1 following a successful fuse-blowing operation in fuse link structure of the present invention. It is seen that for a selected fuse blowing Voltage that the relatively straight line behavior maintained in data lines shown B1 compared to A1 indicate a successful and consistent fuse-blowing operation within a relatively narrow Voltage window using fuse-link structures formed according to preferred embodiments.

Figure 3:
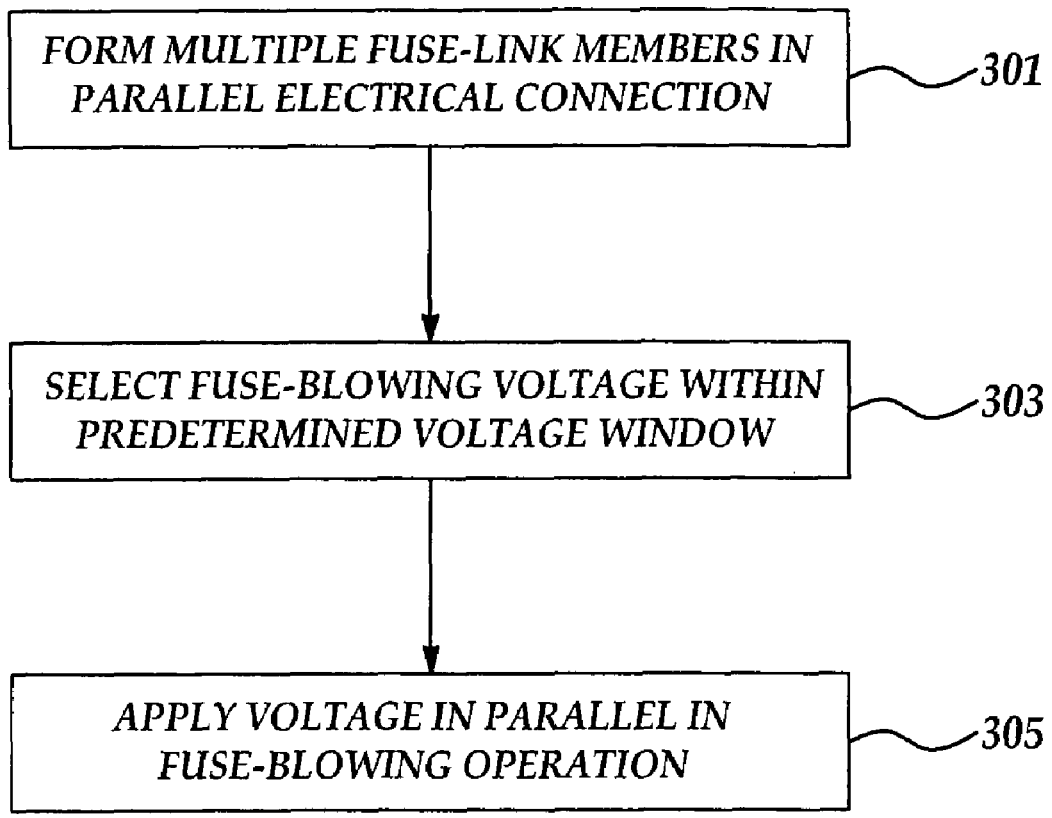
FIG. 3 is a process flow diagram including several embodiments of the method of the present invention.

Referring to FIG. 3, is shown a process flow diagram including several embodiments of the present invention. In process 301 multiple fuse link members formed according to preferred embodiments are formed electrically connected in parallel in a fuse-link structure to a common Voltage input and current output. In process 303, a fuse-blowing Voltage is selected within a pre-determined Voltage window to carry out a programmable fuse blowing determined according to an effective parallel resistance window of the fuse-link structure. In process 305, a fuse-blowing process is carried out by applying a fuse-blowing Voltage.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A multiple fuse-link member fuse-link structure comprising:
   a plurality of elongated spaced apart fuse-link members comprising materials selected from the group consisting of polysilicon, doped polysilicon, and silicide on doped or undoped polysilicon, said fuse-link members electrically connected in parallel according to a common input voltage contact and common output current contact to form a fuse-link structure; and,
   wherein at least a portion of the plurality of elongated fuse-link members prior to said fuse-blowing operation each comprise a different electrical resistance with respect to one another, each of said at least a portion of the plurality having a different structure causing said different electrical resistance, said different structure comprising polysilicon doping condition and critical dimension.

2. The fuse-link structure of claim 1, wherein each of the plurality of elongated fuse-link members comprise a different electrical resistance compared to each other elongated fuse-link member of the plurality.

3. The fuse-link structure of claim 1, wherein the plurality of elongated fuse-link members comprise a lowermost polysilicon layer and an uppermost silicide layer.

4. The fuse-link structure of claim 3, wherein the silicide layer is selected from the group consisting of titanium silicide, cobalt silicide, molybdenum silicide, platinum silicide and nickel silicide.

5. The fuse-link structure of claim 1, wherein the polysilicon doping condition is selected from the group consisting of undoped, P-doped and N-doped.

6. The fuse-link structure of claim 1, wherein said critical dimension comprises at least one of a width and a thickness.

7. The fuse-link structure of claim 1, wherein the elongated fuse-link members comprise a width between about 5 nm and about 500 nm.

8. The fuse-link structure of claim 1, wherein the elongated fuse-link members comprise a width less than about 250 nm.

9. The fuse-link structure of claim 1, wherein the elongated fuse-link members comprise a length between about two times and about ten times of width.

10. The fuse-link structure of claim 1, wherein the pre-determined effective parallel resistance of the fuse-link structure has a pre-determined fuse-blowing Voltage window.

11. A method of performing a single voltage fuse blowing operation to improve a fuse blowing yield in a multiple fuse-link member fuse-link structure having a narrowed single fuse-blowing voltage window comprising:

forming a plurality of elongated spaced apart fuse-link members formed of materials selected from the group consisting of polysilicon, doped polysilicon, and silicide on doped or undoped polysilicon, said fuse-link members electrically connected in parallel according to a common input voltage contact and common output current contact to form a fuse-link structure;

wherein at least a portion of the plurality of elongated fuse-link members prior to said fuse-blowing operation each comprise a different electrical resistance with respect to one another, each of said at least a portion of the plurality having a different structure causing said different electrical resistance, said different structure comprising polysilicon doping condition and critical dimension, said plurality of elongated fuse-link members adapted to have a predetermined effective parallel resistance having said narrowed single voltage fuse blowing voltage window; and, selecting said single fuse-blowing voltage to apply in a programmable fuse-blowing process to the fuse-link structure to accomplish said fuse-blowing operation; and, applying the single fuse-blowing voltage in parallel to the plurality of elongated fuse-link members to accomplish said fuse-blowing operation to substantially prevent a current flow through the fuse-link structure below a threshold Voltage value.

12. The method of claim 11, wherein each of the plurality of elongated fuse-link members comprise a different electrical resistance compared to each other elongated fuse-link member of the plurality.

13. The method of claim 11, wherein the elongated fuse-link members comprise a polysilicon lowermost layer and an uppermost silicide layer.

14. The method of claim 11, wherein the at least a portion of the plurality of elongated fuse-link members are further formed having a different electrical resistance according to said different critical dimension comprising at least one of a width and a thickness.

15. The method of claim 11, wherein the at least a portion of the plurality of elongated fuse-link members are formed having a different electrical resistance according to said polysilicon doping condition selected from the group consisting of P and N doping.

16. The method of claim 11, wherein the at least a portion of the plurality of elongated fuse-link members are formed having a different electrical resistance according the degree of silicon agglomeration prior to the fuse blowing process.

17. The method of claim 11, wherein the silicide layer is selected from the group consisting of titanium silicide, cobalt silicide, molybdenum suicide, platinum silicide and nickel silicide.

18. The method of claim 11, wherein the elongated fuse-link members comprise a width between about 5 nm and about 500 nm.

19. The fuse-link structure of claim 11, wherein the predetermined effective parallel resistance of the fuse-link structure is selected to fall with a pre-determined fuse-blowing Voltage window.

20. A multiple fuse-link member fuse-link structure comprising:

a plurality of elongated fuse-link members comprising polysilicon, said fuse-link members electrically connected in parallel according to a common input voltage contact and common output current contact to form a fuse-link structure; and, wherein at least a portion of the plurality of elongated fuse-link members prior to said fuse-blowing operation comprise a different electrical resistance with respect to one another, each of said at least a portion of the plurality having a different structure causing said different electrical resistance, said different structure comprising critical dimension, polysilicon doping condition, and silicide agglomeration condition; and, wherein said plurality of elongated fuse-link members are adapted to have a predetermined effective parallel resistance for the fuse-link structure, said predetermined effective parallel resistance having a predetermined narrowed fuse-blowing voltage window, said narrowed fuse-blowing voltage window adapted for applying a single fuse-blowing voltage to accomplish a single fuse-blowing operation so as to substantially prevent a current flow through the fuse-link structure below a threshold Voltage value following said single fuse-blowing operation.

* * * * *